United States Patent [19]

Tarvainen et al.

[11] Patent Number: 5,870,352
[45] Date of Patent: Feb. 9, 1999

[54] DC MONITOR FOR ACTIVE DEVICE SPEED

[75] Inventors: Esa Tarvainen, Espoo; Hannu Roukainen, Roukainen, both of Finland

[73] Assignee: Tritech Microelectric International, Ltd., Singapore, Singapore

[21] Appl. No.: 893,639

[22] Filed: Jul. 11, 1997

[51] Int. Cl.[6] .............................. G04F 8/00; G01R 15/12; H04B 17/00; H01L 21/60
[52] U.S. Cl. ...................... 368/113; 368/121; 324/73.1; 371/226; 437/8
[58] Field of Search ............................ 368/113, 118–121; 324/73.1, 158 R; 371/22.5, 22.6; 437/7.8

[56] References Cited

U.S. PATENT DOCUMENTS 5,095,267  3/1992  Merrill et al. ...................... 324/158 R

*Primary Examiner*—Vit Miska
*Attorney, Agent, or Firm*—George O. Saile; Stephen B. Ackerman

[57] ABSTRACT

Methods and circuits to measure the speed of silicon test structures using direct current test equipment. Each test structure comprises an oscillator and a detector. Oscillations started by a direct current input signal are rectified by the detector into a direct current output signal. Start of oscillations cause a jump in the output signal and that point is correlated with the input signal strength which in turn is correlated to the speed of the test circuits. By knowing the speed of the test circuits the quality of the manufacturing process can be checked. Direct current greatly simplifies measurement so that 100% testing can be performed.

22 Claims, 5 Drawing Sheets

DC MONITOR FOR ACTIVE DEVICE SPEED

BACKGROUND OF THE INVENTION

1. Field of the Invention

This invention relates to the testing of high frequency test structures as incorporated in semiconductor device fabrication.

2. Description of the Related Art

U.S. Pat. No. 4,523,312 (Takeuchi) deals with testing of an integrated circuit (IC) mounted in an IC socket, where the IC tester sends test patterns to the IC and receives responses from the IC to be checked for their logic levels.

SUMMARY OF THE INVENTION

It is an object of this invention to show a method and describe a test structure on a semiconductor wafer that allows a fast determination of the speed of semiconductor devices.

It is another object of this invention to increase the speed of testing through direct current measurements so that 100% testing can be performed.

These objects have been accomplished by the use of a plurality of test structures on the semiconductor wafer, manufactured by the same process as the semiconductor devices. Each test structure, consisting of an oscillator and a detector, is connected via probes to test equipment. The oscillator is induced to oscillate by increasing a direct current signal to its inputs. The detector rectifies these oscillations resulting in a jump of the direct current output signal. The magnitude of the input signal is noted for that point and correlates to the frequency or speed of the test circuit. Having earlier correlated the magnitude of the input signal with the frequency of oscillation for a given fabrication process, it is possible to know the speed and, therefore, the quality of the semiconductor manufactured by the same process. A high frequency measurement is, therefore, replaced by simply measuring a direct current input signal and output signal of the test structure. Because the test equipment has to deal only with direct currents, a switching matrix can now be used to quickly measure 100% of the test structures.

DESCRIPTION OF THE PREFERRED EMBODIMENT

In semiconductor fabrication test structures are deposited on the semiconductor wafer to allow verification of the quality of the process. These test structures operate at the same high frequencies as the semiconductor devices themselves. Direct measurements at these very high frequencies are difficult and time-consuming because high frequency test gear cannot be routed through a switching matrix, since the latter has an inherently low cut-off frequency.

Figure 1A:
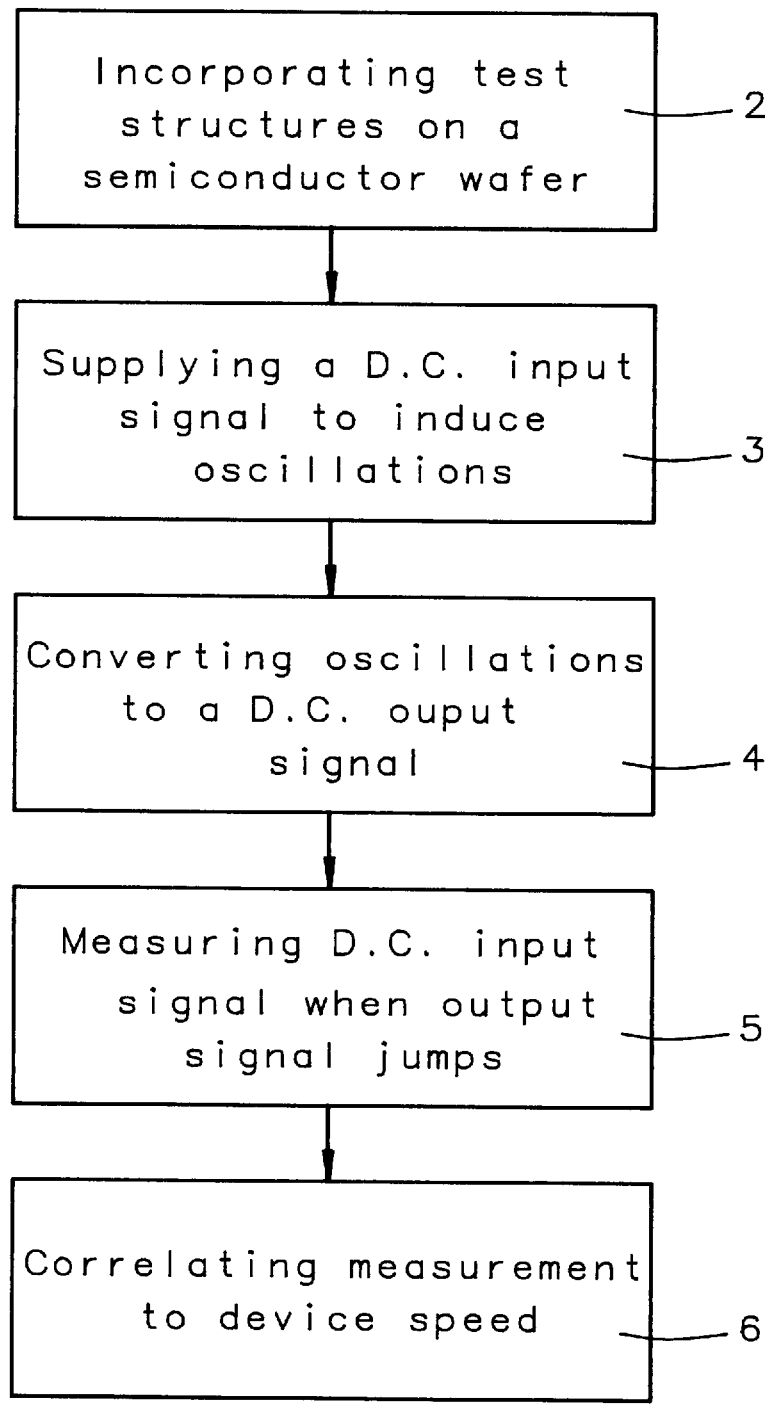
FIG. 1a is a flow diagram showing the method of the invention for measuring a test structure.

Referring now to FIG. 1a, we show a flow diagram depicting the methods of this present invention. In Block 2 a test structure is incorporated into a semiconductor wafer during the regular fabrication process having, therefore, the same device characteristics as the other semiconductor devices. A direct current signal is supplied in Block 3, and increased in strength until it causes electrical oscillations. These electrical oscillations are then converted to a direct current signal and monitored at an output, as shown in Block 4. In Block 5 the input signal is measured when the output signal jumps. Block 6 correlates the input signal measurement to the speed of the test structure device or the quality of the fabrication process. This correlation is possible because the relationship between input signal, output signal, and frequency of oscillation had first been investigated on other semiconductor test structures.

Figure 1B:
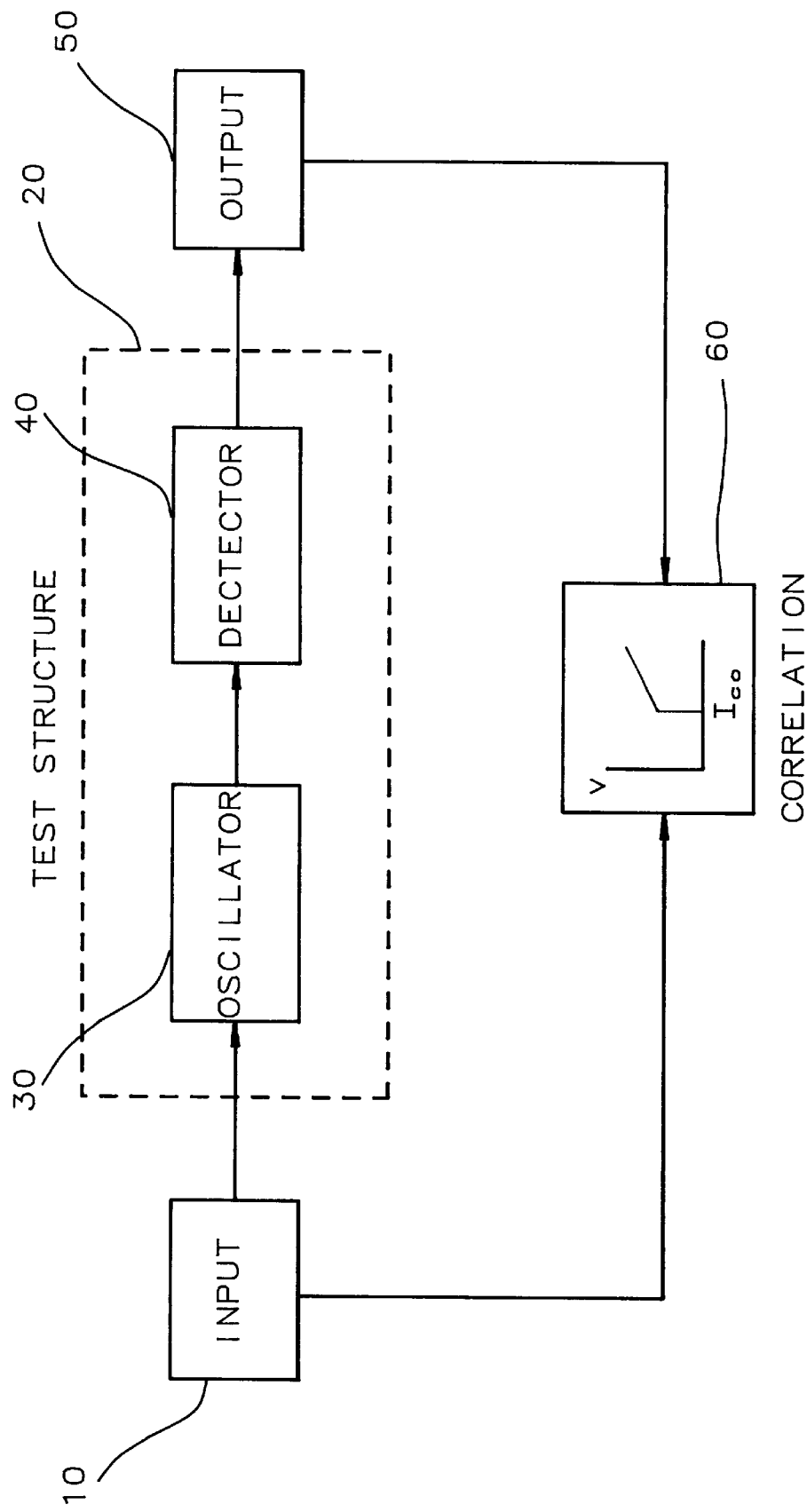
FIG. 1b is a block diagram showing the method of the invention for measuring a test structure.

Referring now to FIG. 1b, we show another block diagram depicting in more detail the methods of this present invention. Only one test structure 20 is shown, however, there normally will be a plurality of these. Input 10 supplies a direct current signal of rising magnitude to the Oscillator 30 part of the test structure. At a certain strength of the input signal oscillations will start. These oscillations are fed to the Detector 40, where they are rectified, resulting in a direct current (D.C.) output signal, measured by Output 50. The point where this sudden rise in voltage occurs is noted and the input signal at that point is labeled, e.g. $I_{CO}$; see Correlation 60. By having first correlated the actual speed, or for example the cut-off frequency $f_T$, to $I_{CO}$ for a given semiconductor process, subsequent $I_{CO}$ measurements of the test structure can be used to characterize the $f_T$, and, therefore, the quality of semiconductor devices manufactured by the same process.

Figure 2A:
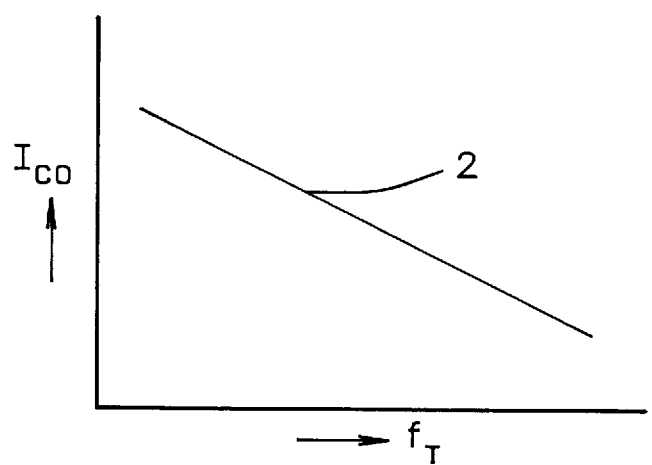
FIG. 2a is a graph showing the correlation between cut-off frequency or device speed, and the input signal.

FIG. 2a is a graph with CURVE 2, showing the relationship of the speed of a test structure, or as an example the $f_T$, and the input signal, i.e. $I_{CO}$. CURVE 2 is seen to decline monotonically, providing good correlation between the input signal on the y-axis and the device speed on the x-axis.

Figure 2B:
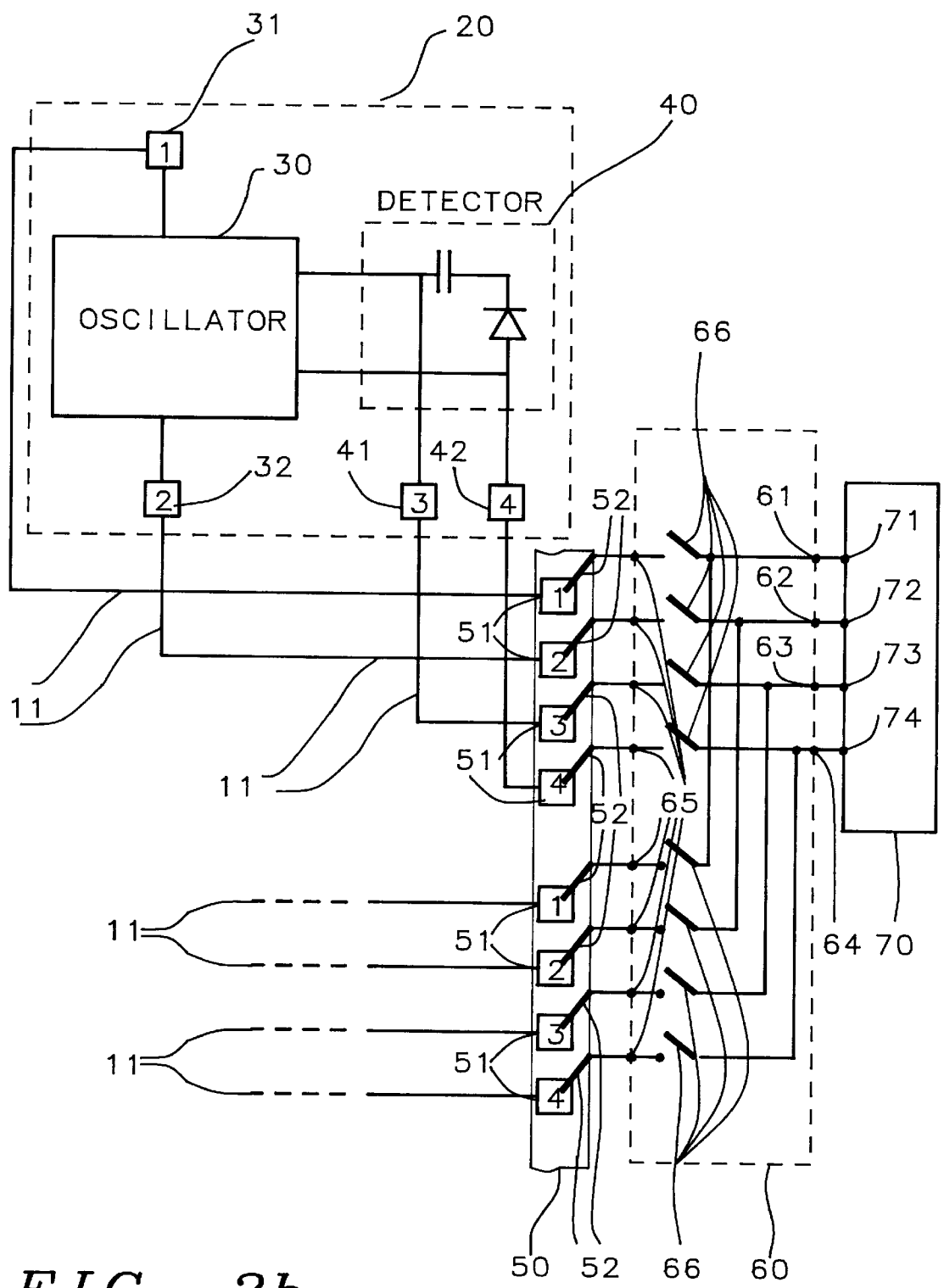
FIG. 2b is a schematic of one of the test structures of the invention, the test gear and switching matrix.

Referring now to test structure 20 of FIG. 2b, we describe the principle of the present invention. A test oscillator 30 having an input 31, equal to Pad 1, is placed on a semiconductor wafer during semiconductor wafer fabrication. Connected to that test oscillator is a test detector 40 having an output 41, equal to Pad 3. That test detector is also placed on the semiconductor wafer during semiconductor wafer fabrication. A test apparatus or some other means attached to input 31, supplies a direct current signal to input 31 and also measures it. The test oscillator will start oscillating at a certain input signal strength applied to input 31. Test detector 40 will rectify those oscillations and produce a direct current signal at output 41. That test apparatus or some other means attached to output 41 detects the presence of a direct current signal at that output. I.e. the detection or measurement of very high frequency oscillations has been turned into the detection of a direct current signal, which is a very simple task as compared to detection, or measurement, of a very high frequency.

The important prior correlation of input signal magnitude with the high frequency oscillations, and therefore, the speed and quality of the devices on the semiconductor wafer has been described previously and need not be repeated here. Test structure 20 also shows the presence of a Pad 2 and 4. These pads may provide e.g. ground or some other reference but are not important to the principle of the invention or its understanding. Similar considerations apply to the pictorial representation of rectification of an alternating current signal by a capacitor and a diode as part of the test detector. Other embodiments for rectification may be chosen as is understood by those skilled in the art.

FIG. 2b is a schematic diagram of the invention incorporating the methods illustrated in FIG. 1b and, adding as an example, a matrix switch and test apparatus. The matrix switch and the test apparatus are for the purpose of illustration only and are not meant to limit the scope of the invention. Similarly this particular embodiment shows a direct current as the input signal and a voltage signal as the output signal but these choices are not meant to limit the scope of the invention since other embodiments regarding the input and output sources are equally possible.

Still referring to FIG. 2b, the schematic shows one of a plurality of test structures 20, consisting of oscillator 30 and detector 40 (depicting a simplified rectifying circuit). Oscillator inputs 31, 32 and detector outputs 41, 42 are connected via metalized lines 11 to metalized pads 51. These pads are located in the scribe line area 50 of the semiconductor wafer where they do not take up valuable silicon real estate. Movable probes 52 are lowered onto contact pads 51 and connect one-to-one to a unique input 65 of the switching matrix 60. Inputs 65 are connected through suitable switching contacts 66 to multiplexed outputs 61, 62, 63, and 64. These outputs are in turn wired to terminals 71, 72, 73, and 74, respectively, of test apparatus 70.

Because there is a set of four (modulo 4) probes for every test structure 20 (two inputs, two outputs), the number of switching inputs 65 is also modulo 4. The switching matrix multiplexes sets of four inputs to four outputs 61, 62, 63, and 64. Contacts 66 are controlled by suitable devices such as reed relays (not shown). Switching matrix 60 is located in reasonable proximity to the semiconductor wafer station. After testing of the first test structure, the switching matrix will connect another set of probes to outputs 61 to 64, and the test apparatus 70 will test a second test structure until all test structures are tested.

Direct current is supplied from terminals 71 to oscillator input 31, while oscillator input 32 is the direct current return to terminal 72. At a certain value of the input current, oscillator 30 will start to oscillate. Detector 40 rectifies these oscillations and produces a D.C. voltage between outputs 41 and 42. This voltage is measured by test apparatus 70 at terminals 73 and 74. The oscillations typically range from about 1000 to 4000 Megahertz. The D.C. output voltage ranges from microvolts to hundreds of millivolts.

Figure 3:
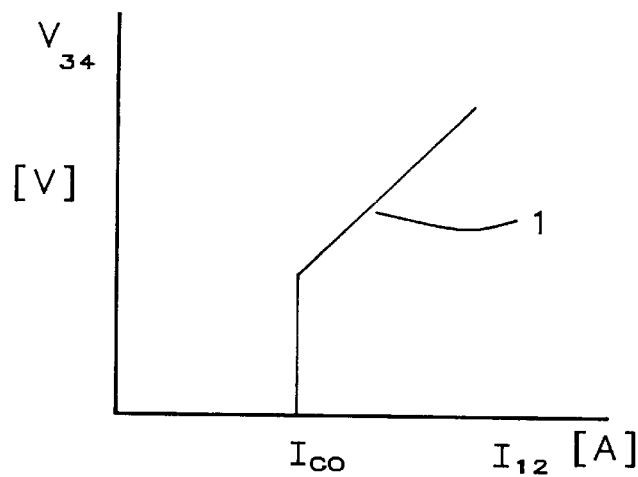
FIG. 3 is a graph showing the correlation between input current and output voltage.

FIG. 3 is a graph with CURVE 1, showing the relationship of the detector D.C. output voltage $V_{34}$ on the ordinate to the direct current input $I_{12}$ on the abscissa. As can be seen, the jump in D.C. voltage $V_{34}$ is quite distinct when oscillations start and is marked on the abscissa by $I_{CO}$. While $V_{34}$ continues to rise as $I_{12}$ rises, the increase is not nearly as dramatic. It is apparent from the foregoing that determining point $I_{CO}$ is non-ambiguous. $I_{CO}$ is, therefore, a reliable measure of the oscillator's cut-off frequency $f_T$. The lower $I_{CO}$ is, the higher $f_T$ is as shown in FIG. 2a. $f_T$, and thus $I_{CO}$, is a direct measure of the fabrication process.

Figure 4:
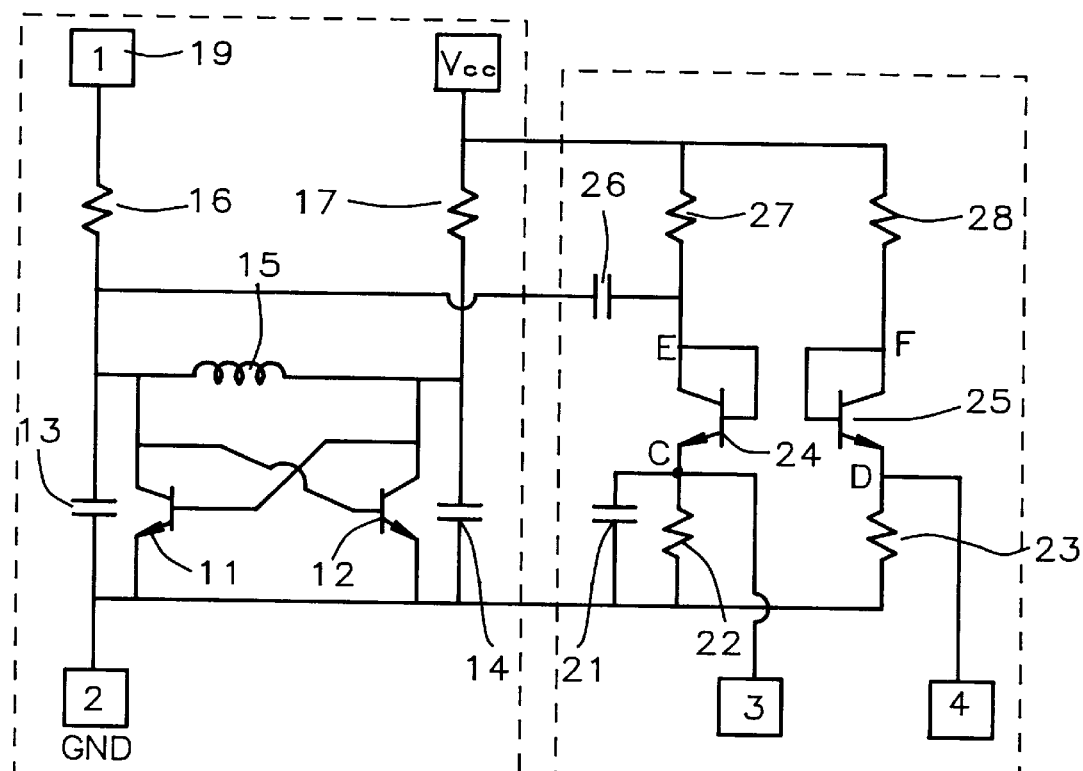
FIG. 4 is a circuit diagram of one of the test structures of the invention.

FIG. 4 is a circuit diagram of one implementation of the invention to characterize the cut-off frequency $f_T$ of semiconductor devices. A plurality of test structures are deposited during semiconductor fabrication for the purpose of verifying the quality of the fabrication process. One of these test structures, consisting of oscillator circuit 10 and detector circuit 20, is described.

The oscillator circuit 10 is made up of two transistors 11 and 12, where the base of each transistor is connected to the collector of the other transistor. Both emitters are tied to GND (pad 2) which is the direct current return path. An inductor 15 is connected between the collector of transistor 11 (Terminal A) and the collector of transistor 12 (Terminal B). Capacitors 13 and 14 connect from Terminal A and B, respectively, to GND. Resistor 16, between input 19 (pad 1) and Terminal A, is the collector resistor for transistor 11. Resistor 17, between $V_{CC}$ and Terminal B, is the collector resistor for transistor 12. Pads 1 and 2 are the inputs to the oscillator circuit, while Terminal A is the output. When no or little input current $I_{12}$ flows, Terminal B is more positive than Terminal A and the base of transistor 11 is forward biased. The transistor conducts and its collector is near GND, thereby cutting off transistor 12. As $I_{12}$ rises, the voltage at Terminal A rises as well and transistor 12 starts to conduct, cutting off transistor 11. Capacitor 13 charges up, while capacitor 14 discharges through transistor 12; this causes current to flow through inductor 15. When current through inductor 15 stops flowing, the emf of the collapsing magnetic field makes Terminal B more positive and Terminal A more negative, thus repeating the cycle and sustaining oscillations.

Terminal A, the output of oscillator circuit 10, is also the input to detector circuit 20 and connects via capacitor 26 to Terminal E. Transistor 24 is wired as a diode by connecting collector and base to Terminal E, while the emitter connects to Terminal C. Capacitor 21, in parallel to resistor 22, connects between Terminal C and GND. Resistor 27, connecting $V_{CC}$ to Terminal E, is the collector resistor for transistor 24. Connected between $V_{CC}$ and GND and acting as a voltage divider are resistor 28, transistor 25 (also in diode configuration) and resistor 23.

High frequency oscillations from the oscillator circuit are rectified by transistor 24 and a voltage is developed across resistor 22, while capacitor 21 reduces the high frequency component of this D.C. voltage. Transistor 25, at Terminal D, produces the reference voltage needed to compensate for $V_{CC}$ variations. Terminals C and D connect to pads 3 and 4, respectively. The voltage seen at the output of the detector circuit is the potential at Terminal C with respect to Terminal D.

Advantages of the present invention are simplification of measurements for high frequency circuits, requiring only the use of D.C. input and output signals to determine the circuit speed. In a production environment significant savings can be realized by using the measurement of, for example, $I_{CO}$ as a process control variable, and do correlation to $f_T$ to determine proper control limits. By replacing high frequency measurements with D.C. measurements it is now possible to quickly measure many test sites and to better characterize the fabrication process.

While the invention has been particularly shown and described with reference to the preferred embodiments thereof, it will be understood by those skilled in the art that various changes in form and details may be made without departing from the spirit and scope of the invention.

What is claimed is:

1. A method to characterize the speed of semiconductor devices on a semiconductor wafer where said speed of said semiconductor devices has been correlated to a direct current input signal of test structures, comprising:

incorporating said test structures on said semiconductor wafer during semiconductor wafer fabrication, each of said test structures having an input and an output;

supplying a direct current input signal to said input to induce electrical oscillations;

converting said electrical oscillations to a direct current output signal at said output;

measuring said direct current input signal when a jump in said direct current output signal is first detected; and correlating said measurement of said direct current input signal to said speed of said semiconductor device.

2. A method to characterize the speed of semiconductor devices on a semiconductor wafer where said speed of said semiconductor devices has been correlated to a direct current input signal of test structures, comprising:

incorporating a plurality of test structures on said semiconductor wafer during semiconductor fabrication, each of said test structures having an oscillator circuit with an input and a detector circuit with an output, said test structures verifying the quality of the semiconductor fabrication process;

connecting, through conducting lines, said input of said oscillator circuit and said output of said detector circuit to a pad each on said semiconductor wafer;

connecting, through test probes, everyone of said pads to a test apparatus;

supplying a direct current signal of changing magnitude from said test apparatus to said input of said oscillator circuit;

measuring with said test apparatus the direct current (D.C.) signal of said output of said detector circuit; and correlating a jump in said D.C. signal to the value of said direct current, said value being labeled $I_{CO}$ of the first test structure.

3. The method of claim 2, wherein each of said oscillator circuits produces high frequency oscillations when a certain minimum direct current signal is provided at said input of said oscillator circuit.

4. The method of claim 2, wherein each of said detector circuits rectifies said high frequency oscillations into a D.C. signal measurable at said output of said detector circuit.

5. The method of claim 2, wherein said pads are located in the scribe line area of said semiconductor wafer.

6. The method of claim 2, wherein the speed of said semiconductor devices on said semiconductor wafer is measured and correlated to said direct current signal $I_{CO}$ at which oscillation starts.

7. The method of claim 6, wherein said $I_{CO}$ of said test structures is correlated to said $I_{CO}$'s of said semiconductor devices.

8. The method of claim 7, wherein the speed of said test structures is correlated to said $I_{CO}$ of said test structure.

9. The method of claim 8, wherein correlation of said $I_{CO}$ to the speed of said test structures allows verification of the quality of the semiconductor fabrication process.

10. A circuit to characterize the speed of semiconductor devices on a semiconductor wafer, comprising:

a test oscillator having an input and placed on said semiconductor wafer during semiconductor wafer fabrication, said test oscillator capable of producing oscillations upon receiving a direct current input signal;

a test detector having an output, said test detector connected to said test oscillator, said test detector placed on said semiconductor wafer during semiconductor wafer fabrication, said test detector capable of converting said oscillations into a direct current signal at said output;

means attached to said input, supplying and measuring said direct current signal at said input; and means attached to said output, measuring said direct current signal at said output.

11. A circuit to characterize the speed of semiconductor devices on a semiconductor wafer, comprising:

a plurality of test structures on said semiconductor wafer, deposited during semiconductor fabrication, with a reference potential, with a first and a second input and a first and second output each, said test structures verifying the quality of the semiconductor fabrication process;

an oscillator circuit, being part of each of said test structures, with said first and second input and an oscillator output, said oscillator circuit producing a high frequency signal at said oscillator output when the direct current at said first and second input reaches a certain value;

a detector circuit, being part of each of said test structures, with said second input, a third input, and a first and second output, said third input connected to said oscillator output, said detector circuit converting said high frequency signal at said third input to a direct current (D.C.) voltage at said first and second output;

a plurality of conducting lines connecting every one of said first and second inputs and first and second outputs to a unique pad on said semiconductor wafer;

a plurality of probes each touching one of said pads, and each of said probes able to be withdrawn from said pads;

a multiplexing switching matrix, located outside of said semiconductor wafer, with a plurality, modulo four, of switching inputs, and first, second, third and fourth multiplexed output, each of said switching inputs connected to one of said probes; and a test apparatus with a first, second, third and fourth test terminal, each of said test terminals connected to one of said multiplexed outputs, said test apparatus providing a direct current of changing magnitude to said oscillator circuit, and measuring said D.C. voltage of said detector circuit.

12. The circuit of claim 11, wherein said oscillator circuit comprises:

said reference potential;

said first input, to which a first signal is applied, said first signal corresponding to a changing direct current;

said second input, which is the return path for direct current;

a first npn transistor having an emitter, a base and a collector, said emitter of said first npn transistor connected to said second input, and said collector of said first npn transistor connected to a terminal A;

a second npn transistor having an emitter, a base and a collector, said emitter of said second npn transistor connected to said second input, said base of said second npn transistor connected to said terminal A, and said collector of said second npn transistor connected to said base of said first npn transistor and to a terminal B;

a first capacitor connected between said second input and said terminal A;

a second capacitor connected between said second input and said terminal B;

an inductor connected between said terminal A and said terminal B;

a first resistor connected between said first input and said terminal A;

a second resistor connected between said reference potential and said terminal B; and said oscillator output connected to terminal A.

13. The circuit of claim 11, wherein said detector circuit comprises:

said reference potential;

said second input which is the return path for direct current;

said third input connected to said oscillator output;

a third capacitor connected between said second input and a terminal C;

a third resistor connected between said second input and said terminal C;

a fourth resistor connected between said second input and a terminal D;

said first output connected to said terminal C;

said second output connected to said terminal D;

a third npn transistor having an emitter, a base and a collector, said emitter of said third npn transistor connected to said terminal C, said base and said collector of said third npn transistor connected to a terminal E;

a fourth npn transistor having an emitter, a base and a collector, said emitter of said fourth npn transistor connected to said terminal D, said base and said collector of said third npn transistor connected to a terminal F;

a fourth capacitor connected between said third input and said terminal E;

a fifth resistor connected between said terminal E and said reference voltage; and a sixth resistor connected between said terminal F and said reference voltage.

14. The circuit of claim 11, wherein said first, second, third, and fourth multiplexed output of said multiplexing switching matrix is connected through switching means to said plurality, modulo four, of switching inputs.

15. The circuit of claim 14, wherein said multiplexing switching matrix allows testing of all of said test structures by one test apparatus.

16. The circuit of claim 11, wherein said first, second, third, and fourth test terminal of said test apparatus is connected one-to-one to said first, second, third, and fourth multiplexed output of said multiplexing switching matrix.

17. The circuit of claim 11, wherein said first test terminal of said test apparatus provides said direct current of changing magnitude to said first input of said oscillator circuit.

18. The circuit of claim 11, wherein said second test terminal of said test apparatus provides a return path for direct current for said second input of said oscillator circuit.

19. The circuit of claim 11, wherein said third test terminal of said test apparatus measures the D.C. voltage of said first output of said detector circuit.

20. The circuit of claim 11, wherein said fourth test terminal of said test apparatus measures the reference voltage of said second output of said detector circuit.

21. The circuit of claim 11, wherein said oscillator circuit may produce frequencies in the range from 1000 to 4000 Megahertz.

22. The circuit of claim 11, wherein said D.C. signal at said first and second output may range from microvolts to hundreds of millivolts.

* * * * *

UNITED STATES PATENT AND TRADEMARK OFFICE
CERTIFICATE OF CORRECTION

PATENT NO. : 5,870,352
DATED : February 9, 1999
INVENTOR(S) : Esa Tarvainen, et. al.

It is certified that error appears in the above-identified patent and that said Letters Patent is hereby corrected as shown below:

Title page, item [75], delete "Roukainen, Roukainen" and replace with -- Ronkainen, Soukantie --.

Signed and Sealed this

Twenty-first Day of September, 1999

Attest:

Q. TODD DICKINSON

*Attesting Officer*   *Acting Commissioner of Patents and Trademarks*